United States Patent [19]

Mikogami et al.

[11] Patent Number: 5,176,982
[45] Date of Patent: Jan. 5, 1993

[54] PHOTOSENSITIVE RESIN COMPOSITION FOR FORMING A POLYIMIDE FILM PATTERN

[75] Inventors: Yukihiro Mikogami, Yokohama; Shuzi Hayase, Kawasaki; Yoshihiko Nakano, Tokyo, all of Japan

[73] Assignee: Kabushiki Kaisha Toshiba, Kawasaki, Japan

[21] Appl. No.: 726,276

[22] Filed: Jul. 5, 1991

[30] Foreign Application Priority Data

Jul. 5, 1990 [JP] Japan ................... 2-176303
Sep. 28, 1990 [JP] Japan ................... 2-259033

[51] Int. Cl.$^5$ .................. G03C 1/492; C08F 2/50; C08L 77/00; C08L 83/00
[52] U.S. Cl. .................. 430/270; 525/431; 522/134; 522/148; 522/35; 522/905; 528/25
[58] Field of Search .................. 430/270; 522/8, 33, 522/134, 148, 35, 905; 525/431; 528/25

[56] References Cited

U.S. PATENT DOCUMENTS

| | | | |
|---|---|---|---|
| 4,321,319 | 3/1982 | Shoji et al. | 430/270 |
| 4,406,764 | 9/1983 | Hayase et al. | 522/29 |
| 4,437,959 | 3/1984 | Hayase et al. | 522/29 |
| 4,599,155 | 7/1986 | Suzuki et al. | 522/8 |
| 4,698,295 | 10/1987 | Pfeifer et al. | 430/270 |
| 4,865,949 | 9/1989 | Yamamura et al. | 430/270 |
| 4,898,806 | 2/1990 | Pfeifer | 430/270 |

FOREIGN PATENT DOCUMENTS 62-181285  3/1962  Japan.
259752  6/1971  Japan.

OTHER PUBLICATIONS

World Patent Index Latest, Week 9015, Derwent Publications Ltd., London, GB; AN90-110550 & JP-A-2 059 752 (Toshiba K.K.)"abstract".
Polymer Preprints, Japan, vol. 39, No. 3, (1990), p. 802.

*Primary Examiner*—Marion E. McCamish
*Assistant Examiner*—Susan Berman
*Attorney, Agent, or Firm*—Oblon, Spivak, McClelland, Maier & Neustadt

[57] ABSTRACT

Disclosed is a photosensitive resin composition for forming a polyimide film pattern. The composition contains a polyamic acid and at least one silyl ketone compound represented by general formula (II) given below,

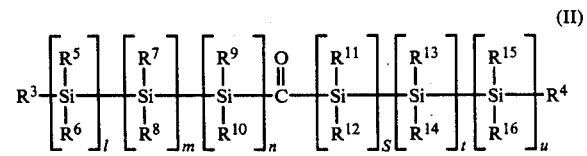

where each of $R^3$ to $R^{16}$ is a are substituted or unsubstituted alkyl group having 1 to 12 carbon atoms or a substituted or unsubstituted aromatic group having 6 to 14 carbon atoms, each of $R^5$ to $R^{16}$ may be a substituted or unsubstituted silyl group, and each of l, m, n, s, t and u is 0 or 1, at least one of l, m, n, s, t and u being 1. The composition further contains a sensitizer, as required. A semiconductor substrate is coated with the composition, followed by exposing the coating through a predetermined mask and subsequently developing and heat-treating the coating so as to form a polyimide film pattern.

19 Claims, No Drawings

PHOTOSENSITIVE RESIN COMPOSITION FOR FORMING A POLYIMIDE FILM PATTERN

BACKGROUND OF THE INVENTION
1. Field of the Invention

The present invention relates to a photosensitive resin composition for forming a polyimide film pattern used in a semiconductor device.

2. Description of the Related Art

A passivation film is formed in general on the surface of a semiconductor device in order to protect the device from the external environment and to improve the reliability of the device. A polyimide resin excellent in electrical properties such as an insulating property and in the resistance to heat is widely used as a material of the passivation film. The polyimide resin is also used widely for forming an interlayer insulating film included in a multilayer interconnection structure of the semiconductor device.

A passivation film or interlayer insulating film of polyimide is prepared as follows. In the first step, the predetermined surface of a semiconductor device is coated with varnish of polyamic acid, i.e., precursor to the polyimide resin. Then, the coating is subjected to a heat treatment. As a result, the polyamic acid is subjected to a cyclizing reaction so as to be thermally set and, thus, to form a desired polyimide resin film.

In many cases, it is necessary to pattern the passivation film and the interlayer insulating film included in a semiconductor device. In general, PEP (photo engraving process) using a photoresist is employed for patterning the polyimide passivation film and interlayer insulating film. To be more specific, a polyimide film is formed first on a semiconductor substrate as described above, followed by forming a photoresist film on the polyimide film. The photoresist film thus formed is exposed to light and, then, developed so as to form a resist pattern. Further, a selective etching is applied to the polyimide layer with the resist pattern used as an etching mask so as to form a polyimide passivation film or interlayer insulating film of a desired pattern.

In the conventional method of forming a polyimide passivation film or interlayer insulating film of a desired pattern, however, it is necessary to employ independently the step for forming the polyimide film and the pattern forming step utilizing PEP, leading to a complex process for forming a polyimide film of a desired pattern.

SUMMARY OF THE INVENTION

An object of the present invention is to simplify the process for forming a polyimide film of a desired pattern. To be more specific, the present invention is intended to provide a photosensitive resin composition, which is a precursor to a polyimide exhibiting a light sensitivity required for a photoresist.

According to the present invention, there is provided a photosensitive resin composition comprising a polyamic acid having a repeating unit represented by general formula (I) given below and at least one silyl ketone compound represented by general formula (II) given below:

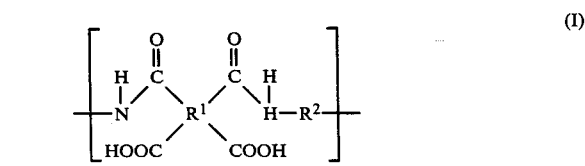

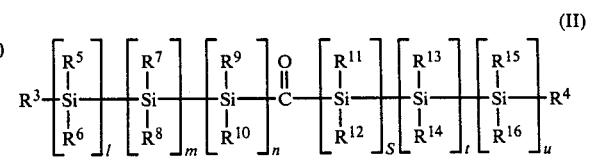

where, R¹ is a substituted or unsubstituted

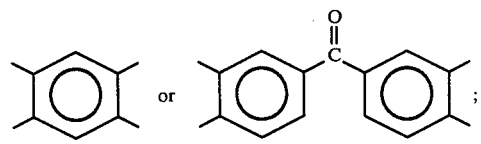

R² is a divalent organic rinking group; each of R³ and R⁴ is a substituted or unsubstituted alkyl group having 1 to 12 carbon atoms or a substituted or unsubstituted aromatic group having 6 to 14 carbon atoms; each of R⁵ to R¹⁶ is a substituted or unsubstituted alkyl group having 1 to 12 carbon atoms, a substituted or unsubstituted aromatic group having 6 to 14 carbon atoms, or a substituted or unsubstituted silyl group; and each of l, m, n, s, t and u is 0 or 1, at least one of l, m, n, s, t and u being 1.

It is possible for the photosensitive resin composition of the present invention to contain a sensitizer.

The photosensitive resin composition of the present invention can be used as an ordinary photoresist which is used for PEP. However, it is most effective to use the resin composition of the present invention for forming a polyimide film pattern incorporated in a semiconductor device as a passivation film or interlayer insulating film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

DETAILED DESCRIPTION OF THE PREFERRED EMBODIMENTS

The present invention is featured in that the photosensitive resin composition contains the silyl ketone compound (II) as a photosensitive agent. The silyl ketone compound (II) used in the present invention includes, for example, compounds (SK-1) to (SK-18) shown in Table A described below.

In the present invention, it is possible to use the silyl ketone compound (II) in the form of a solution prepared by dissolving the compound (II) in an organic solvent such as toluene, xylene, N,N-dimethyl formamide, N-methyl-2-pyrrolidone, or hexamethyl phosphoamide. It is desirable to use the compound (II) in an amount of 5 to 60 parts by weight based on 100 parts by weight of the polyamic acid. Where the amount of the silyl ketone compound (II) is larger than 60 parts by weight, the thickness of the cured film, i.e., a polyimide film pattern formed by using a resin composition of the present invention, is markedly diminished upon heating, with the result that the resolution performance of the pattern tends to be impaired. However, where the amount of the compound (II) is smaller than 5 parts by weight, the photosensitivity of the composition is lowered, resulting in failure to form a satisfactory pattern. Preferably, the compound (II) should be used in an amount of 10 to 30 parts by weight.

A polyamic acid constitutes the resin component of the photosensitive resin composition of the present invention. It is possible to use any kind of polyamic acid, which is used in general in the manufacture of a polyimide resin, as far as the polymer has a repeating unit represented by formula (I).

The polyamic acid preferably used in the present invention is synthesized by bringing any one of a monoamine represented by general formula (III) and a dicarboxylic anhydride represented by general formula [IV] into a polycondensation reaction with a tetracarboxylic dianhydride represented by general formula (V) and a diamine represented by general formula (VI) in the presence of an organic solvent:

  (III)

where "A" is a monovalent organic group,

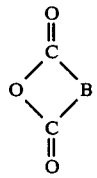  (IV)

where "B" is a divalent organic group,

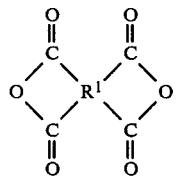  (V)

where $R^1$ is as defined in formula (I),

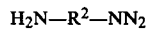  (VI)

where $R^2$ is as defined in formula (I).

In the case of using the monoamine (III), tetracarboxylic dianhydride (V) and diamine (VI) in the polycondensation reaction noted above, synthesized is a polyamic acid represented by general formula (VII) given below:

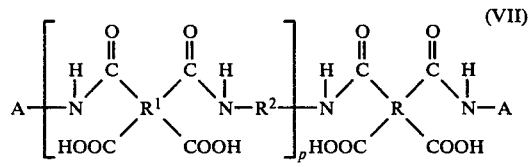  (VII)

where "p" is a positive integer.

In the case of using the dicarboxylic anhydride (IV), tetracarboxylic dianhydride (V) and diamine (VI) in the polycondensation reaction noted above, synthesized is a polyamic acid represented by general formula (VIII) given below:

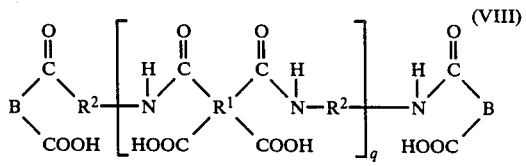  (VIII)

where "q" is a positive integer.

The monoamine represented by general formula (III) includes, for example, m-aminodiphenyl, p-aminodiphenyl, m-aminodiphenyl ether, p aminodiphenyl ether, aniline, o-anisidine, m-anisidine, p-anisidine, p-aminobenzaldehyde, o-toluidine, m-toluidine and p-toluidine.

The dicarboxylic anhydride represented by general formula (IV) includes, for example, phthalic anhydride, hexahydrophthalic anhydride, methyl nadic anhydride, 4-methyl hexahydrophthalic anhydride, methyl tetrahydrophthalic anhydride, and maleic anhydride.

The tetracarboxylic dianhydride represented by general formula (V) includes, for example, pyromellitic dianhydride, 3,3',4,4'-benzophenone tetracarboxylic dianhydride, 2,3,3',4'-benzophenone tetracarboxylic dianhydride, 3,3',4,4'-biphenyltetracarboxylic dianhydride, bis (3,4-dicarboxyphenyl) methane dianhydride, 2,2-bis (3',4'-dicarboxyphenyl) propane dianhydride, bis (3,4-dicarboxyphenyl) sulfonic dianhydride, bis (3,4-dicarboxyphenyl) dimethylsilane dianhydride, bis (3,4-dicarboxyphenyl) tetramethyl disiloxane dianhydride, 1,4,5,8-naphthalene-tetracarboxylic dianhydride, 2,3,6,7-naphthalene-tetracarboxylic dianhydride, and butane tetracarboxylic dianhydride. These tetracarboxylic dianhydride compounds can be used singly or in combination.

The diamine represented by general formula (VI) should include at least one aromatic diamine. The specific aromatic diamine used in the present invention includes, for example, m-phenylene diamine, p-phenylene diamine, 2,4-tolylene diamine, 3,3'-diaminophenyl ether, 4,4'-diaminodiphenyl ether, 3,4'-diaminodiphenyl ether, 3,3'-diaminodiphenyl sulfone, 4,4'-diaminodiphenyl sulfone, 3,3'-diaminodiphenyl methane, 4,4'-diaminodiphenyl methane, 3,4'-diaminodiphenyl methane, 4,4'-diaminodiphenyl sulfide, 3,3'-diaminodiphenyl ketone, 4,4'-diaminodiphenyl ketone, 3,4'-diaminodiphenyl ketone, 2,2'-bis (p-aminophenyl) propane, 2,2'-bis (p-aminophenyl) hexafluoropropane, 1,3-bis (p-aminophenoxy benzene), 1,4-bis (p-aminophenoxy benzene), 4-methyl-2,4-bis (p-aminophenyl)-1-pentene, 1,4-bis (α,α-dimethyl-p-aminobenzyl) benzene, imino-di p-phenylenediamine, 1,5-diaminonaphthalene, 2,6-diaminonaphthalene, 4-methyl-2,4-bis (p-aminophenyl pentane), 5 (or 6)-amino-1-(p-aminophenyl)-1,3,3-trimethyl indane, bis (p-aminophenyl) phosphinoxide, 4,4'-diamino azobenzene, 4,4'-diaminodiphenylurea, 4,4'-bis (p-aminophenyl) biphenyl, 2,2-bis [p-(p'-aminophenoxy) phenyl] propane, 2,2-bis[p-(m-aminophenoxy)phenyl] benzophenon, 4,4'-bis (p-aminophenoxy) diphenyl sulfone, 4,4'-bis [p-(α,α-dimethyl-p-aminobenzyl) phenoxy] diphenyl sulfone, bis (4-aminophenyl) dimethylsilane, bis (4-aminophenyl) tetramethyl disiloxane, and bis (p-aminophenyl) tetramethyl disiloxane.

In the aromatic diamines exemplified above, it is possible for at least one atom or group selected from the group consisting of chlorine, fluorine, bromine, methyl, methoxy and phenyl to substitute for the hydrogen atom bonded to the aromatic ring.

In addition to the aromatic diamines exemplified above, siloxane compounds can also be used in some cases as the diamine represented by formula (VI). For example, it is possible to use bis (γ-aminopropyl) tetramethyl disiloxane, 1,4-bis (γ-aminopropyl dimethylsilyl) benzene, bis (4-aminobutyl) tetramethyl disiloxane, bis (γ-aminopropyl) tetrapnenyl cisiloxane,

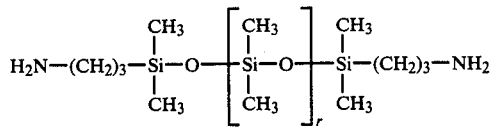

where, "r" is an integer of 2 to 12.

These siloxane compounds provide preferred diamines used in the present invention because these siloxane compounds are effective for improving the adhesion between the polyimide film, which is finally obtained from the resin composition of the present invention, and the semiconductor substrate.

The organic solvent used in the present invention for carrying out the polycondensation reaction includes, for example, N,N-dimethylformamide, N,N-dimethylacetoamide, N-methyl-2 pyrrolidone, N-methyl-ε-caprolactam, γ-butyrolactone, sulfolane, N,N,N',N'-tetramethylurea, and hexamethylphosphoamide.

In the reaction for synthesizing the polyamic acid used in the present invention, the ratio of the sum of the monoamine (III) and diamine (VI) to the sum of the dicarboxylic anhydride (IV) and the tetracarboxylic dianhydride (V) is determined such that the equivalent ratio of the amino group (—NH₂) to the acid anhydride group

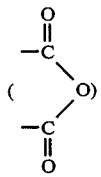

is about 100:100.

Also, the synthesizing reaction should be carried out at −15° C. to +30° C. for 10 minutes to 20 hours.

In order to facilitate the coating of a semiconductor substrate with the polyamic acid thus prepared, it is desirable for the polyamic acid to have a logarithmic viscosity, measured at 30° C. within an N-methyl-2-pyrrolidone solvent at a polymer concentration of 0.5 g/dl, of 0.4 to 1.0 dl/g, preferably, 0.5 to 0.9 dl/g.

For controlling the logarithmic viscosity of the polyamic acid to fall within the range described above, the mixing ratio of the starting materials is controlled as described below. Specifically, in the case of synthesizing the polyamic acid (VII), i.e., in the polycondensation reaction using the monoamine (III), the tetracarboxylic anhydride (V) and the diamine (VI), the molar ratio of the monoamine [III]to the diamine (VI) should be preferably 0.01 to 0.2 : 0.9 to 0.995, more preferably, 0.02 to 0.06 : 0.97 to 0.99. If the amount of the monoamine (III) is unduly large, it is impossible to synthesize a polyamic acid having a desired logarithmic viscosity, resulting in failure to obtain a cured polyimide film having a smooth surface. On the other hand, an unduly small amount of the monoamine (III) makes it impossible to obtain a sufficient effect on the molecular terminal treatment of the polyamic acid (VII), giving rise to a difficulty in terms of the workability.

In the case of synthesizing the polyamic acid (VIII), i.e., in the polycondensation reaction using the dicarboxylic anhydride (IV), tetracarboxylic anhydride (V) and the diamine (VI), the molar ratio of the dicarboxylic anhydride (VI) to the tetracarboxylic anhydride (V) should be preferably 0.01 to 0.2 : 0.9 to 0.995, more preferably, 0.02 to 0.06 : 0.97 to 0.99. If the amount of the dicarboxylic anhydride (IV) is unduly large, it is difficult to synthesize a polyamic acid (VIII) having a sufficiently large logarithmic viscosity, resulting in failure to obtain a cured polyimide film having a smooth surface. On the other hand, an unduly small amount of the dicarboxylic anhydride (IV) makes it difficult to obtain a sufficient effect on the molecular terminal treatment of the polyamic acid (VIII).

Where the siloxane compound exemplified previously is used as the diamine (VI) in the synthesis of the polyamic acid (VII) or (VIII), it is desirable to use the siloxane compound in an amount of 0.01 to 20 mol % based on the total amount of the amines (monoamine being converted into diamine in the calculation). If the amount of the siloxane compound exceeds 20 mol %, the heat resistance of the final product of the polyimide film tends to be lowered. If the amount is smaller than 0.1 mol %, however, it is difficult to obtain the effect of improving the adhesion between the resultant polyimide film and the semiconductor substrate.

The photosensitive resin composition of the present invention is prepared by stirring at about room temperature a mixture containing the silyl ketone compound and the polyamic acid until a homogeneous mixture is obtained.

In order to improve the photosensitivity, it is possible to allow the photosensitive resin composition of the present invention to contain a sensitizer serving to promote the photodegradation of the silyl ketone compound (II). The sensitizer used in the present invention includes, for example, benzophenone compounds, thioxanthone compounds, and phenothiazine compounds. Specific examples (SE-1) to (SE-14) of these compounds are shown in Table B described below.

In the photosensitive resin composition of the present invention, the sensitizer is used in an amount of 0.001 to 20% by weight based on the amount of the main component consisting of the polyamic acid and the silyl ketone compound. If the amount of the sensitizer is smaller than 0.001% by weight, the sensitizer fails to produce its effect. If the amount exceeds 20% by weight, however, the resultant polyimide film fails to exhibit satisfactory properties as a protective film.

The photosensitive resin composition of the present invention is used for forming a patterned passivation film or an interlayer insulating film, as described below. In the first step, a photosensitive resin composition of the present invention is dissolved in an organic solvent. The resultant solution is filtered so as to remove fine foreign matters, followed by coating the surface of a semiconductor substrate with the purified solution by a rotary coating method or a dipping method. The coating is prebaked (or dried) so as to form a photosensitive resin composition layer. It is desirable to perform the prebaking at about 80° to 100° C. for 5 to 20 minutes. If the drying temperature is lower than 80° C., or the drying time is shorter than 5 minutes, the coated film surface is rendered viscous, giving rise to inconveniences in the subsequent steps. On the other hand, if the drying temperature is higher than 100° C., or the drying time is longer than 20 minutes, the photosensitive resin composition layer is excessively cured before the exposure step. In this case, the solubility of the resin composition layer in a developing solution is lowered during the developing process after the exposure step, leading to deformation of the polyimide pattern which is finally formed. Preferably, the drying should be carried out for 7 to 13 minutes.

In the next step, the photosensitive resin composition layer is selectively irradiated through a desired mask pattern with an energy beam such as a visible radiation, infrared radiation, ultraviolet radiation or electron beam (exposure step). In this step, the silyl ketone compound (II) contained in the irradiated portion (exposed portion) of the photosensitive resin composition layer is subjected to photodegradation and, then, reacts with a polyamic acid having a repeating unit represented by general formula (I).

Incidentally, the photodegradation reaction and the accompanying reactions utilized in the present invention are generally considered to be carried out in line with reaction mechanism A or B illustrated below:

Reaction Mechanism A;

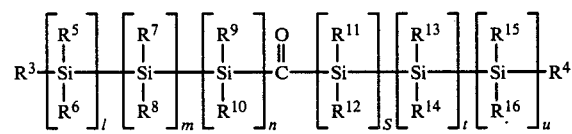

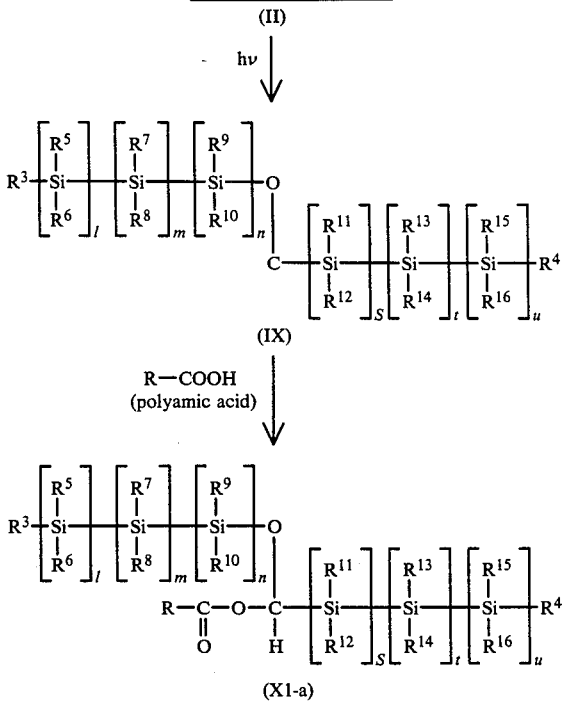

(At least "n" of "l", "m", "n", "n", "s", "t" and "u" included in the formula given above is not zero.

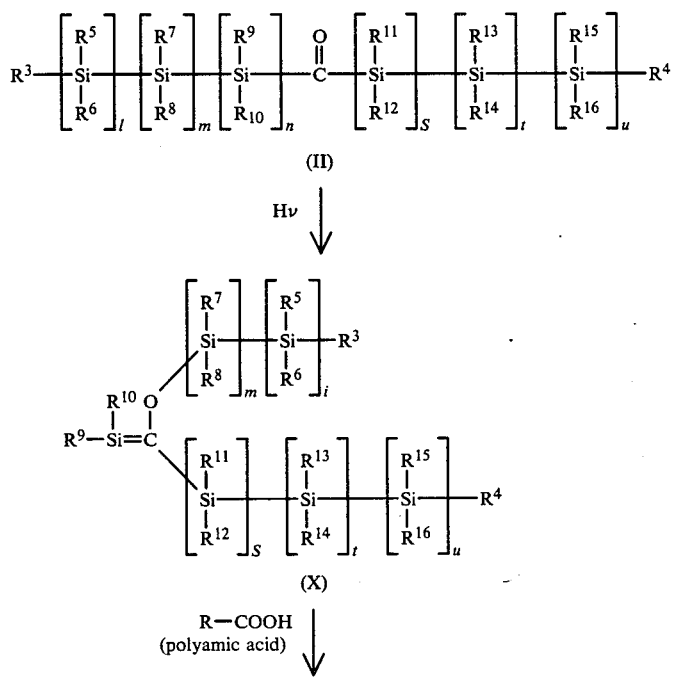

Reaction Mechanism B;

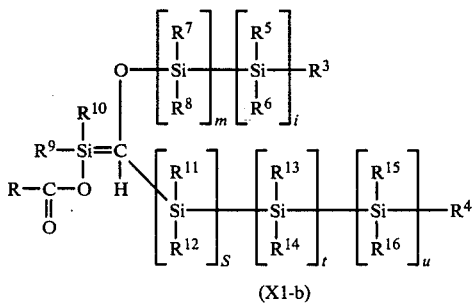

(XI-b)

(At least "n" of "l", "m", "n", "s", "t" and "u" included in the formulas given above is not zero.)

In the reaction mechanism A, carbene (IX) is formed first by the 1,2-shifting of the silyl ketone compound (II). Carbene (IX) performs an addition reaction with the carboxyl group of the polyamic acid having a repeating unit represented by general formula (I) so as to cap the carboxyl group and, thus, a general structure (XI-a) is formed.

When it comes to the reaction mechanism B, an intermediate product (X) is formed first by the 1,3-shifting of the silyl ketone compound (II). The intermediate product (X) performs an addition reaction with the carboxyl group of the polyamic acid having a repeating unit represented by general formula (I) so as to cap the carboxyl group and, thus, a general structure (XI-b) is formed.

At any rate, it has been confirmed that finally formed is the structure (XI-a) or (XI-b), wherein the carboxyl group of the polyamic acid is capped.

Which of the reaction mechanisms A and B is followed by the silyl ketone compound (II) acting as the photosensitive agent in the present invention is determined by the chemical structure of the compound (II). Specifically, the majority of molecules of the silyl ketone compound (II) follow the reaction mechanism A in the case where the compound (II) is constructed such that at least two of "l", "m", "n" are zero and at least two of "s", "t", "u" are zero, though all of these "l", "m", "n", "s", "t", "u" are not zero. In other words, the majority of molecules of the silyl ketone compound (II) follow the reaction mechanism A in the case where a chain of two or more silicon atoms is not bonded to the carbon atom of the ketone group. The silyl ketone compounds (SK-1) to (SK-6) and (SK-11) shown in Table A are of this type.

On the other hand, the majority of molecules of the silyl ketone compounds (II) follow the reaction mechanism B in the case where the compound (II) is constructed such that at least two of "l", "m", "n" are 1 or at least two of "s", "t", "u" are 1. In other words, the majority of molecules of the silyl ketone compounds (II) follow the reaction mechanism B in the case where at least one chain of two or more silicon atoms is bonded to the carbon atom of the ketone group. The silyl ketone compounds (SK-7) to (SK-10) and (SK-12 to (SK-18) shown in Table A are of this type.

The most important object in this step is to cap the carboxyl group of the polyamic acid. The object is achieved by the reaction mechanism A or B. In the reaction mechanism A, however, carbene (IX) is the intermediate product which caps the carboxyl group. What should be noted is that carbene (IX) is unstable and highly reactive, with the result that the carbene (IX) tends to react with the polyamic acid in the portion other than the carboxyl group portion. On the other hand, the reaction to have the carboxyl group capped with the intermediate product (X) proceeds with substantially 100% of probability, when it comes to the reaction mechanism B. Naturally, the reaction mechanism B is higher than the reaction mechanism A in the efficiency of having the carboxyl group of the polyamic acid capped with the intermediate product. In other words, it is desirable to use in the present invention the silyl ketone compound (II) in which at least one chain of two or more silicon atoms is bonded to the carbon atom of the ketone group. Particularly, the silyl ketone compound having a side chain of a silyl group such as (SK-16) and (SK-17) shown in Table A are most desirable in the present invention because all molecules of the silyl ketone compound follow reaction mechanism B in the exposure step.

It is desirable for the photosensitive resin composition of the present invention to contain a sensitizer, because the photodegradation reaction of the silyl ketone compound (II) is promoted by the sensitizer.

After the exposure step, the photosensitive resin composition layer is developed by means of a dipping method or spraying method using an alkaline developing solution (developing step). The alkaline developing solution used in the present invention includes an organic alkaline aqueous solution such as an aqueous solution of tetramethylene ammonium hydroxide and an inorganic alkaline aqueous solution such as an aqueous solution of potassium hydroxide or an aqueous solution of sodium hydroxide.

It should be noted that the polyamic acid remains unchanged in the non-exposed portion of the photosensitive resin composition layer, with the result that the carboxyl group of the polyamic acid reacts with the alkali metal ion or ammonium ion present in the alkaline developing solution so as to form a salt, which is dissolved in the solution. In the exposed portion, however, the polyamic acid is already converted into the general structure (XI-a) or (XI-b) without the hydroxyl group, as described previously. It follows that the exposed portion is not dissolved in the organic or inorganic alkaline aqueous solution. In other words, the exposed portion alone of the photosensitive resin composition layer is selectively left unremoved in the developing step so as to form a desired pattern. Needless to say, the composition of the present invention performs the function of a negative photosensitive material in which the exposed portion is rendered insoluble in the developing solution.

In the developing step, it is possible to control the difference in solubility between the exposed portion and the non-exposed portion of the photosensitive resin composition layer by controlling the developing time or the concentration of the developing solution. However, the photosensitive resin composition of a polyamic acid type as in the present invention is highly soluble in an aqueous developing solution. Thus, it is desirable to achieve a subtle adjustment in the difference in solubility between the exposed portion and the nonexposed portion of the photosensitive resin composition layer by applying an after-baking treatment to the composition layer at 120° to 180° C. for 5 to 20 minutes after the exposure step and before the developing step, in addition to the adjustment in the concentration of the aqueous developing solution and in the developing time. If the after-baking treatment is performed at a temperature lower than 120° C. or the treating time is shorter than 5 minutes, the photosensitive resin composition layer including both the exposed portion and the non-exposed portion tends to be dissolved in the developing solution. By the contrary, where the after-baking temperature is higher than 180° C., or the treating time is longer than 20 minutes, the photosensitive resin composition layer including both the exposed portion and the non-exposed portion tends to remain unsolved in the developing solution, resulting in failure to obtain a desired pattern. It should be noted that the solubility of the photosensitive resin composition layer in the developing solution is markedly changed within a relatively narrow temperature range about 150° C. Thus, it is particularly desirable to apply the after-baking treatment at 140 to 160° C. Where the after-baking temperature is lower than 140° C., the photosensitive resin composition layer still maintains a high solubility in the developing solution, making it difficult in some cases to control the developing time as desired. On the other hand, where the after-baking temperature is higher than 160° C., the curing of the photosensitive resin composition layer proceeds excessively. It follows that the solubility of the composition layer is lowered, resulting in failure to obtain a satisfactory polyimide pattern. It is particularly desirable to carry out the after-baking treatment for 7 to 13 minutes.

After the developing step, rinsing with, for example, water, alcohol or acetone is applied so as to remove the residual developing solution, followed by applying a baking treatment.

After the baking treatment, the patterned photosensitive resin composition layer is heated at a predetermined temperature. The heating permits releasing the silyl ketone derivative which caps the carboxyl group as denoted by general structure (XI-a) or (XI-b) so as to cyclize the polyamic acid and, thus, to form a patterned film of polyimide having a repeating unit represented by general formula (XII) given below:

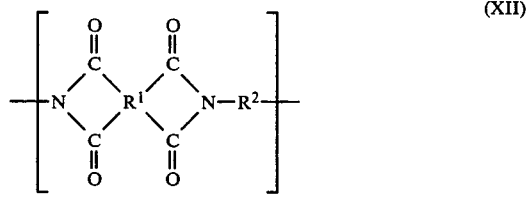
(XII)

where $R^2$ and $R^2$ are as defined previously.

The patterned polyimide film thus formed can be used as an etching mask in PEP. Also, the polyimide film, which exhibits an excellent electrical insulating property and an excellent thermal resistance, can also be used satisfactorily as a passivation film or an interlayer insulating film in a semiconductor device.

In the heating step described above, it is desirable to gradually elevate the temperature from 90° C. to 400° C. If the heating temperature is not elevated gradually, part of the polyamic acid tends to fail to be converted into polyimide, with the result that the thermal stability of the resultant polyimide film is impaired.

Incidentally, it is known to the art to utilize the photosensitivity of a polyfunctional silyl ketone for the optical crosslinking reaction of resin, as disclosed in, for example, Published Unexamined Japanese Patent Application No. 62-181285 and "Polymer Pre-prints, Japan, Vol. 139, 1990, page 802". However, it is quite unknown to the art to achieve the photosensitivity and developing property by impairing the solubility o a polyamic acid in an alkaline solution. Suppose the polyfunctional silyl ketone disclosed in the publications exemplified above is subjected to development with an alkaline aqueous solution as in the present invention. In this case, the polyfunctional silyl ketone tends to remain in the resultant polyimide film formed after the heating for synthesizing polyimide, with the result that the thermal stability of the polyimide film is impaired. In other words, it is very important to use the silyl ketone compound represented by general formula (II) for obtaining a polyimide film pattern exhibiting excellent properties.

As described above, the photosensitive resin composition of the present invention performs two different functions. To reiterate, the composition can be used as a negative photosensitive material and can be used for forming a polyimide film acting as a passivation film or an interlayer insulating film. It should be noted that use of the composition of the present invention makes it possible to carry out successively the photoresist process for pattern formation and the film-forming process by applying a series of treatments including the coating of a semiconductor substrate with the particular composition in the formation of a passivation film or an interlayer insulating film. Thus, it is possible to simplify the processes.

EXAMPLE 1

A nitrogen gas dried with phosphorus pentaoxide was introduced into a reaction flask equipped with a stirring rod, a thermometer and a dropping funnel. Also introduced into the flask were 4.635 g (0.21 mol) of pyromellitic dianhydride, 19.993 g (0.062 mol) of 3,3',4,4'-benzophenone tetracarboxylic dianhydride, 0.333 g (0.003 mol) of maleic anhydride and 100 g of N-methyl-2-pyrrolidone. The mixture was fully stirred and cooled to −5° C. within the flask.

On the other hand, 15.996 g (0.081 mol) of 4,4'-diamino diphenyl ether and 1.199 g (0.003 mol) of bis (γ-aminopropyl) tetramethyl disiloxane were dissolved in 69 g of N-methyl-2-pyrrolidone, and the resultant solution was slowly dripped into the reaction flask. The resultant liquid mixture was maintained at −5° to 0° C. for 4 hours within the flask and, then, reaction was carried out at room temperature (20° C.) for 4 hours so as to synthesize a polyamic acid.

The resultant mixture of the polyamic acid and N-methyl-2-pyrrolidone was found to have a logarithmic viscosity, measured at 30° C., of 0.82 dl/g.

In the next step, the polyamic acid solution was mixed with the silyl ketone compound (SK-2) shown in Table A. The mixture was fully stirred at 20° C. until a homogeneous mixture was obtained. At this time, both components were mixed in such an amount ratio that 2 g of the silyl ketone compound was mixed with 10 g of the resin solid component consisting of the polyamic acid. The homogeneous mixture was passed through a membrane filter having a pore size of 0.5 μm so as to prepare a photosensitive resin composition of the present invention.

Then, a silicon wafer having a diameter of 3 inches was coated with the photosensitive resin composition by using a spin coater, followed by heating the wafer, which was put on a hot plate of 100° C., for 10 minutes so as to obtain a photosensitive resin composition layer having a thickness of 4.0 μm. Further, the resin composition layer was selectively exposed for 180 seconds through a quartz mask for a resolution performance test. Used in this step was CA800 (trademark of a contact exposure apparatus manufactured by Cobilt Inc.).

The wafer was dipped for 30 seconds in a resist developing solution, i.e., 0.90% aqueous solution of tetramethyl ammonium hydroxide, followed by water-wash for 20 seconds so as to form a pattern. A cross section of the pattern was observed by an electron microscope. Recognized was a clear pattern having a resolution of 5 μm with respect to the line and space, i.e., a pattern formed of films each having a width of 5 μm and a clearance between adjacent films of 5 μm.

Further, the photosensitive resin compositions of the present invention were prepared as above, except that silyl ketone compounds (SK-5), (SK-6) and (SK-11) were used in place of (SK-2). These resin compositions were subjected to the experiment reported above. It has been found that these resin compositions also permit forming good patterns having a resolution of 5 μm.

EXAMPLE 2

A polyamic acid solution was prepared as in Example 1, except that used in Example 2 was a raw material composition as shown in Table 1 described below.

Then, the resultant polyamic acid solution was mixed with the silyl ketone compound (SK-13) shown in Table A, as shown in Table 1. The liquid mixture was sufficiently stirred at 20° C. until a homogeneous mixture was obtained. The homogeneous mixture was passed through a membrane filter having a pore size of 0.5 μm so as to prepare a photosensitive resin composition of the present invention.

The photosensitive resin composition thus prepared was evaluated with respect to various properties as follows:

EVALUATION FOR RESOLUTION PERFORMANCE

A silicon wafer having a diameter of 3 inches was coated with the photosensitive resin composition of Example 2 by using a spin coater, followed by pre-baking the wafer, which was put on a hot plate of 90° C., for 10 minutes so as to obtain a photosensitive resin composition layer having a thickness of 5.0 μm. Further, the resin composition layer was selectively exposed for 60 seconds through a quartz mask for a resolution performance test. Used in this step was a contact exposure apparatus CA800 referred to previously. After the exposure step, an after-baking treatment was applied under the conditions given below:

a) No after-baking
b) 120° C. × 10 minutes
c) 150° C. × 10 minutes
d) 180° C. × 10 minutes Then, each of the wafers was dipped for 60 minutes in a resist developing solution, i.e., 2.38% aqueous solution of tetramethyl ammonium hydroxide, followed by water-wash for 20 seconds so as to form a pattern. A cross section of the pattern was observed with an electron microscope, with the results as summarized below:

a) A pattern was hardly recognized. In other words, the film was substantially dissolved so as to expose the wafer surface to the outside.

b) A pattern was recognized only slightly. The most part of the film surface was found dissolved.

c) A satisfactory pattern was recognized, with a resolution of 2.5 μm with respect to the line and space of the pattern.

d) The surface state of the film before the developing process remained substantially unchanged. In other words, the developing process did not bring about any change in the surface state of the film.

The resolution performance test reported above clearly indicates that, in the photosensitive resin composition of the present invention, the after-baking treatment carried out after the exposure step under predetermined conditions permits moderating the restrictions in terms of the concentration of the alkaline aqueous solution used in the developing process and the developing time, making it possible to readily form a good film pattern.

EVALUATION FOR ADHESION TO A SILICON WAFER

The wafer coated with the resin composition of Example 2 to which the after baking treatment c) had been applied in the resolution performance test was put in a constant temperature dryer and heated step-wise, i.e., at 150° C. for 1 hour, at 250° C. for 1 hour and, then, at 320° C. for 1 hour, so as to cure the photosensitive resin composition layer formed on the wafer. Further, the wafer was heated at 120° C. for 24 hours under a saturated steam of 2 atms., followed by applying "checker's test" so as to evaluate the adhesion between the film pattern and the wafer It has been found that the photosensitive resin composition layer did not peel at all from the wafer, supporting a strong adhesion between the resin composition layer and the wafer.

EVALUATION FOR THERMAL RESISTANCE

A silicon wafer having a diameter of 3 inches was coated with the photosensitive resin composition of Example 2 with a spinner. Then, the wafer was heated on a hot plate of 90° C. for 10 minutes so as to form a photosensitive resin composition layer having a thickness of 5.0 μm. Further, the wafer was put in a constant temperature dryer and heated step-wise, i.e., at 150° C. for 1 hour, at 250° C. for 1 hour and, then, at 320° C. for 1 hour, so as to cure the photosensitive resin composition layer formed on the wafer. After the heat treatment, the composition layer was peeled with a knife off the wafer and subjected to a thermogravimetric analysis. It has been found that weight reduction caused by the thermal decomposition was not recognized when the heating temperature was elevated to about 400° C.

EXAMPLES 3-8

Polyamic acid solutions were prepared as in Example 1, except that the raw material compositions used in these Examples were as shown in Table 1. Table 1 also shows the logarithmic viscosities of these polyamic acid solutions. Further, the polyamic acid solution was mixed with a predetermined amount of the silyl ketone compound (SK-4), (SK 5), (SK-6), (SK-11) or (SK-13), as shown in Table 1. The mixture was sufficiently stirred at 20° C. until a homogeneous mixture was obtained. The homogeneous mixture was passed through a membrane filter having a pore diameter of 0.5 μm so as to prepare a photosensitive resin composition.

It should be noted that the abbreviations used in Table 1 denote:
BPDA: 3,3',4,4'-biphenyl tetracarboxylic dianhydride
BTDA: 3,3',4,4'-benzophenone tetracarboxylic dianhydride
PMDA: pyromellitic dianhydride
DPE: 4,4'-diamino diphenyl ether
DAM: 4,4'-diamino diphenyl methane
ASi-a: bis (γ-aminopropyl) tetramethyl disiloxane ASi-b:

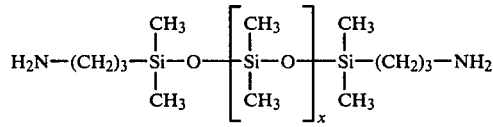

(x = 4)

A: aniline
T: o-toluidine
A-a: phthalic anhydride
A-b: hexahydro phthalic anhydride
A-c: methylnadic anhydride
A-d: 4-methyl hexahydro phthalic anhydride
A-e: maleic anhydride The silyl ketone compounds (SK-4), (SK-5), (SK-6), (SK-11), and (SK-13) are as shown in Table A.

TABLE 1

| | | \multicolumn{7}{c}{Example} | | | | | | |
|---|---|---|---|---|---|---|---|---|
| | | 2 | 3 | 4 | 5 | 6 | 7 | 8 |
| Polyamic acid composition | | | | | | | | |
| Tetracarboxylic dianhydride (g) | BPDA | — | 17.653 | — | 5.884 | — | — | — |
| | BTDA | 19.993 | 12.888 | 17.721 | 18.688 | 11.921 | 15.788 | 22.554 |
| | PMDA | 4.635 | — | 9.815 | 4.362 | 13.086 | 10.905 | 6.107 |
| Diamine (g) | DPE | 15.996 | — | 19.219 | 18.819 | — | 10.010 | 18.819 |
| | DAM | — | 18.439 | — | — | 19.232 | 8.922 | — |
| | ASi-a | 1.119 | 0.944 | — | 1.491 | 0.746 | — | — |
| | Asi-b | — | — | 1.089 | — | — | 2.178 | 3.267 |
| Monoamine (g) | A | — | 0.559 | — | — | — | — | — |
| | T | — | — | 0.428 | — | — | — | — |
| Dicarboxylic dianhydride | A-a | — | — | — | 0.592 | — | — | — |
| | A-b | — | — | — | — | 0.924 | — | — |
| | A-c | — | — | — | — | — | 0.356 | — |
| | A-d | — | — | — | — | — | — | 0.672 |
| | A-e | 0.333 | — | — | — | — | — | — |
| Synthetic conditions | temp. (°C.) | −5 to 20 | −5 to 25 | −10 to 25 | 0 to 25 | 0 to 25 | 0 to 25 | 0 to 25 |
| | time (h) | 8 | 8 | 8 | 7 | 7 | 7 | 7 |
| Logarithmic viscosity (dl/g) | | 0.82 | 0.82 | 0.79 | 0.58 | 0.92 | 0.79 | 0.61 |
| Amount of resin solid component (g) | | 10 | 10 | 10 | 10 | 10 | 10 | 10 |
| Amount of silyl ketone compound | SK-13 | 2.0 | — | — | — | — | 2.0 | — |
| | SK-6 | — | 2.5 | — | — | — | — | 2.5 |
| | SK-11 | — | — | 2.0 | — | — | — | — |
| | SK-4 | — | — | — | 2.0 | — | — | — |
| | SK-5 | — | — | — | — | 3.0 | — | — |

The photosensitive resin compositions thus prepared in Examples 3-8 were evaluated with respect to various properties as follows:

EVALUATION FOR RESOLUTION PERFORMANCE

The resolution performance was evaluated as in Example 2 with respect to the photosensitive resin compositions for Examples 3-8 In this case, the after-baking treatment was carried out at 150° C. for 10 minutes, as in condition c) in Example 2. A cross section of each of the patterns obtained was observed with an electron microscope so as to measure the resolution Table 2 shows the results.

EVALUATION FOR ADHESION TO A SILICON WAFER

An adhesion test was applied as in Example 2 to each of the photosensitive resin compositions prepared in Examples 3-8 so as to evaluate the adhesion of the photosensitive resin composition layer to the silicon wafer. Table 2 also shows the results.

EVALUATION FOR THERMAL RESISTANCE

A thermal resistance test was applied as in Example 2 to each of the photosensitive resin compositions prepared in Examples 3-8 so as to evaluate the thermal resistance of the resin composition on a silicon wafer. Table 2 also shows the results.

As apparent from Table 2, the polyimide film pattern formed by using each of the photosensitive resin compositions prepared in Example 3 to 8 exhibits excellent resolution performance, adhesion to a silicon wafer and thermal resistance. Particularly, a prominent resolution was achieved in Example 7 in which used as a photosensitive agent was the silyl ketone compound (SK-13) having at least two consecutive silicon atoms included in the main chain.

Recognized was a clear pattern having a resolution of 5 μm with respect to the line and space.

Further, the photosensitive resin compositions of the present invention were prepared as above, expect that silyl ketone compounds (SK-5), (SK-6) and (SK-11) were used together with the benzophenone series sensitizers defined in the present invention in place of (SK-2)

TABLE 2

| | Example | | | | | | |
|---|---|---|---|---|---|---|---|
| | 2 | 3 | 4 | 5 | 6 | 7 | 8 |
| Coated film thickness (μm) | 5.0 | 5.5 | 6.0 | 5.5 | 4.0 | 6.0 | 5.5 |
| Resolution performance (resolution/μm) | 2.5 | 3.5 | 5.0 | 4.5 | 4.0 | 2.5 | 6.0 |
| Adhesion to a silicon wafer (checker's test for evaluating adhesion)* | 0/100 | 0/100 | 4/100 | 0/100 | 1/100 | 0/100 | 0/100 |
| Thermal resistance (10% weight reduction temperature)** | 410 | 450 | 412 | 430 | 420 | 430 | 420 |

*Checker's test for evaluating adhesion: adhesion strength to silicon wafer after heating for 24 hours under a saturated steam of 2 atms.
**10% weight reduction temperature (°C.): measured by TGA after thermal curing at 320° C.

EXAMPLE 9

A polyamic acid solution was prepared exactly as in Example 1.

In the next step, the polyamic acid solution was mixed with silyl ketone compound (SK-2) shown in Table A and a benzophenone series sensitizer (SE-12) shown in Table C. The mixture was fully stirred at 20° C. until a homogeneous mixture was obtained. At this time, these components were mixed in such an amount ratio that 3.0 g of the silyl ketone compound and 0.10 g of the sensitizer were mixed with 10 g of the resin solid component consisting of the polyamic acid. The homogeneous mixture was passed through a membrane filter having a pore size of 0.5 μm so as to prepare a photosensitive resin composition of the present invention.

Then, a silicon wafer having a diameter of 3 inches was coated with the photosensitive resin composition by using a spin coater, followed by heating the wafer, which was put on a hot plate of 100° C., for 10 minutes so as to obtain a photosensitive resin composition layer having a thickness of 4.0 μm. Further, the resin composition layer was selectively exposed for 130 seconds through a quartz mask for a resolution performance test. Used in this step was CA800 referred to previously.

The wafer was dipped for 30 seconds in a resist developing solution, i.e., 0.90% aqueous solution of tetramethyl ammonium hydroxide, followed by water-wash for 20 seconds so as to form a pattern. A cross section of the pattern was observed by an electron microscope These resin compositions were subjected to the experiment reported above It has been found that these resin compositions also permit forming good patterns having a resolution of 5 82 m.

EXAMPLES 10-16

Polyamic acid solutions were prepared as in Example 9 using the raw material compositions shown in Table 3 described below. Table 3 also shows the logarithmic viscosities of these polyamic acid solutions.

Then, each of these polyamic acid solutions was mixed with a predetermined amount of the silyl ketone compound (SK-4), (SK-6), (SK-11) or (SK-13) and with a predetermined amount of a sensitizer (SE-7), (SE-13) or (SE-14), as shown in Table 3. The resultant mixture was sufficiently stirred at 20° C. until a homogeneous mixture was obtained. The homogeneous mixture was passed through a membrane filter having a pore diameter of 0.5 μm so as to prepare photosensitive resin compositions for Examples 10-16.

It should be noted that a sensitizer is not contained in the photosensitive resin compositions for Examples 15 and 16.

Incidentally, the abbreviations used in Table 3 are the same as those used in Table 1. Also, silyl ketone compounds (SK-4), (SK-6), (SK-11) and (SK-13) shown in Table 3 are as defined in Table A. Likewise, sensitizers (SE-7), (SE-12), (SE-13) and (SE-14) shown in Table 3 are as defined in Table B.

TABLE 3

| | | Example | | | | | | |
|---|---|---|---|---|---|---|---|---|
| | | 10 | 11 | 12 | 13 | 14 | 15 | 16 |
| Polyamic acid composition | | | | | | | | |
| Tetracarboxylic dianhydride (g) | BPDA | — | 17.653 | — | 5.884 | — | — | — |
| | BTDA | 19.993 | 12.888 | 17.721 | 18.688 | 11.921 | 15.788 | 22.554 |
| | PMDA | 4.635 | — | 9.815 | 4.362 | 13.086 | 10.905 | 6.107 |
| Diamine (g) | DPE | 15.996 | — | 19.219 | 18.819 | — | 10.010 | 18.819 |
| | DAM | — | 18.439 | — | — | 19.232 | 8.922 | — |
| | ASi-a | 1.119 | 0.944 | — | 1.491 | 0.746 | — | — |
| | Asi-b | — | — | 1.089 | — | — | 2.178 | 3.267 |
| Monoamine (g) | A | — | 0.559 | — | — | — | — | — |
| | T | — | — | 0.428 | — | — | — | — |
| Dicarboxylic | A-a | — | — | — | 0.592 | — | — | — |

TABLE 3-continued

|  |  | Example | | | | | | |
|---|---|---|---|---|---|---|---|---|
|  |  | 10 | 11 | 12 | 13 | 14 | 15 | 16 |
| dianhydride | A-b | — | — | — | — | 0.924 | — | — |
|  | A-c | — | — | — | — | — | 0.356 | — |
|  | A-d | — | — | — | — | — | — | 0.672 |
|  | A-e | 0.333 | — | — | — | — | — | — |
| Synthetic conditions | temp. (°C.) | −5 to 20 | −5 to 25 | −10 to 25 | 0 to 25 | 0 to 25 | 0 to 25 | 0 to 25 |
|  | time (h) | 8 | 8 | 8 | 7 | 7 | 7 | 7 |
| Logarithmic viscosity (dl/g) |  | 0.82 | 0.82 | 0.79 | 0.58 | 0.92 | 0.79 | 0.61 |
| Amount of resin solid component (g) |  | 10 | 10 | 10 | 10 | 10 | 10 | 10 |
| Amount of silyl ketone compound | SK-13 | 2.8 | 3.0 | — | — | — | 3.0 | — |
|  | SK-6 | — | — | 2.8 | — | — | — | 3.2 |
|  | SK-11 | — | — | — | 2.4 | — | — | — |
|  | SK-4 | — | — | — | — | 2.4 | — | — |
|  | SK-7 | 0.12 | — | — | — | — | — | — |
| Amount of sensitizer (g) | SE-13 | — | 0.12 | — | 0.12 | — | — | — |
|  | SE-14 | — | — | 0.20 | — | 0.20 | — | — |

Each of the photosensitive resin compositions prepared in Examples 10–16 was evaluated with respect to various properties as follows:

EVALUATION FOR RESOLUTION PERFORMANCE

A silicon wafer having a diameter of 3 inches was coated with the photosensitive resin composition of Example 10 by using a spin coater, followed by prebaking the wafer, which was put on a hot plate of 90° C., for 10 minutes so as to obtain a photosensitive resin composition layer having a thickness of 5.0 μm. Further, the resin composition layer was selectively exposed for 40 seconds through a quartz mask for a resolution performance test. Used in this step was a contact exposure apparatus CA800 referred to previously. After the exposure step, an after-baking treatment was applied under the conditions given below:

a) No after-baking
b) 120° C.×10 minutes
c) 150° C.×10 minutes
d) 180° C.×10 minutes Then, each of the wafers was dipped for 60 minutes in a resist developing solution, i.e., 2.38% aqueous solution of tetramethyl ammonium hydroxide, followed by water-wash for 20 seconds so as to form a pattern. A cross section of the pattern was observed with an electron microscope, with the results as summarized below:

a) A pattern was hardly recognized. In other words, the film was substantially dissolved so as to expose the wafer surface to the outside.

b) A pattern was recognized only slightly. The most part of the film surface was found dissolved.

c) A satisfactory pattern was recognized, with a resolution of 2.5 μm with respect to the line and space of the pattern.

d) The surface state of the film before the developing process remained substantially unchanged. In other words, the developing process did not bring about any change in the surface state of the film.

The resolution performance test reported above clearly indicates that, in the photosensitive resin composition of the present invention, which contains a sensitizer, the after-baking treatment carried out after the exposure step under predetermined conditions permits moderating the restrictions in terms of the concentration of the alkaline aqueous solution used in the developing process and the developing time, making it possible to readily form a good film pattern.

A similar experiment wa conducted for each of the photosensitive resin compositions prepared in Examples 11–16, except that the after-baking treatment was performed at 150° C. for 10 minutes, i.e., condition c) noted above. A cross section of each of the patterns thus formed was observed with an electron microscope so as to measure the resolution. Table 4 shows the results.

EVALUATION FOR ADHESION TO A SILICON WAFER

The adhesion of the photosensitive resin composition prepared in each of Examples 10 16 to a silicon wafer was evaluated as in Example 2 described above. Table 4 also shows the results.

EVALUATION FOR THERMAL RESISTANCE

A thermal resistance test was applied as in Example 2 to the photosensitive resin composition layer formed on a silicon wafer with respect to the composition prepared in each of Examples 10–16. Table 4 also shows the results.

As apparent from Table 4, the photosensitive resin composition containing a sensitizer specified in the present invention prepared in each of Examples 10 to 16 permits forming a polyimide film pattern excellent in any of resolution performance, adhesion to a silicon wafer and thermal resistance.

TABLE 4

|  | Example | | | | | | |
|---|---|---|---|---|---|---|---|
|  | 10 | 11 | 12 | 13 | 14 | 15 | 16 |
| Coated film thickness (μm) | 5.0 | 5.0 | 6.2 | 5.7 | 4.5 | 5.0 | 5.5 |
| Resolution | 2.5 | 4.0 | 4.5 | 4.5 | 5.0 | 15.0 | 20.0 |

TABLE 4-continued

| | Example | | | | | | |
|---|---|---|---|---|---|---|---|
| | 10 | 11 | 12 | 13 | 14 | 15 | 16 |
| performance (resolution/μm) | | | | | | | |
| Adhesion to a silicon wafer (checker's test for evaluating adhesion)* | 0/100 | 0/100 | 0/100 | 0/100 | 1/100 | 10/100 | 20/100 |
| Thermal resistance (10% weight reduction temperature)** | 410 | 450 | 430 | 430 | 440 | 400 | 400 |

*Checker's test for evaluating adhesion: adhesion strength to silicon wafer after heating for 24 hours under a saturated steam of 2 atms.
**10% weight reduction temperature (°C.): measured by TGA after thermal curing at 320° C.

As described above in detail, the photosensitive resin composition of the present invention permits simplifying the step of forming a polyimide film pattern in the manufacture of a semiconductor device. Also, the polyimide film formed by using the composition of the present invention exhibits excellent resolution performance, adhesion to a semiconductor substrate and thermal resistance.

TABLE A

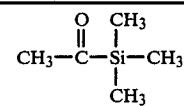
(SK-1)

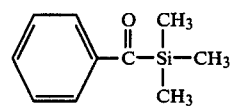
(SK-2)

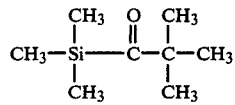
(SK-3)

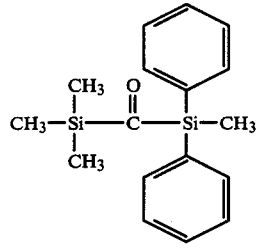
(SK-4)

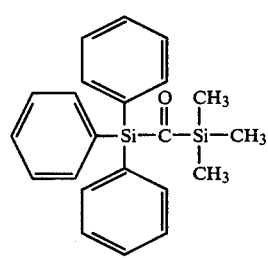
(SK-5)

TABLE A-continued

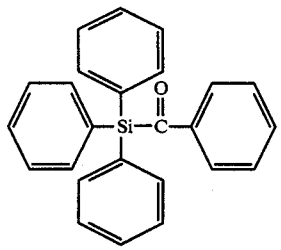
(SK-6)

(SK-7)
$$CH_3-\underset{\underset{CH_3}{|}}{\overset{\overset{CH_3}{|}}{Si}}-\underset{\underset{CH_3}{|}}{\overset{\overset{CH_3}{|}}{Si}}-\overset{O}{\underset{\|}{C}}-CH_3$$

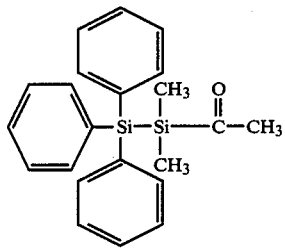
(SK-8)

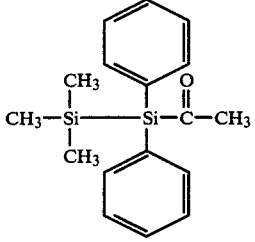
(SK-9)

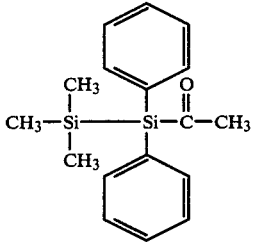

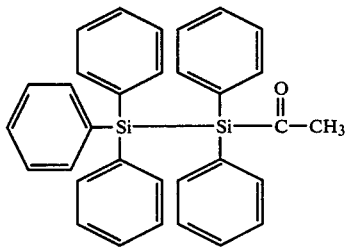
(SK-10)

TABLE A-continued
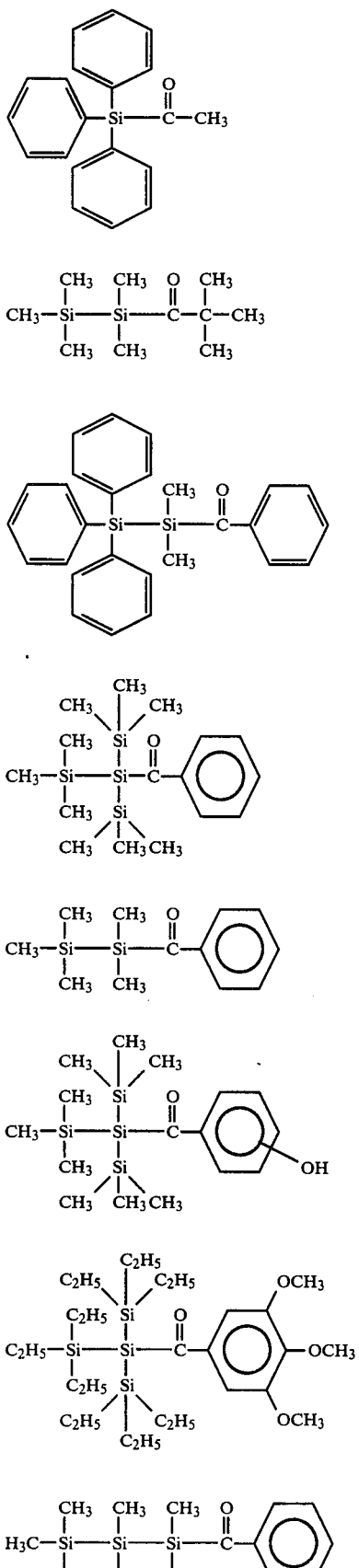
TABLE B
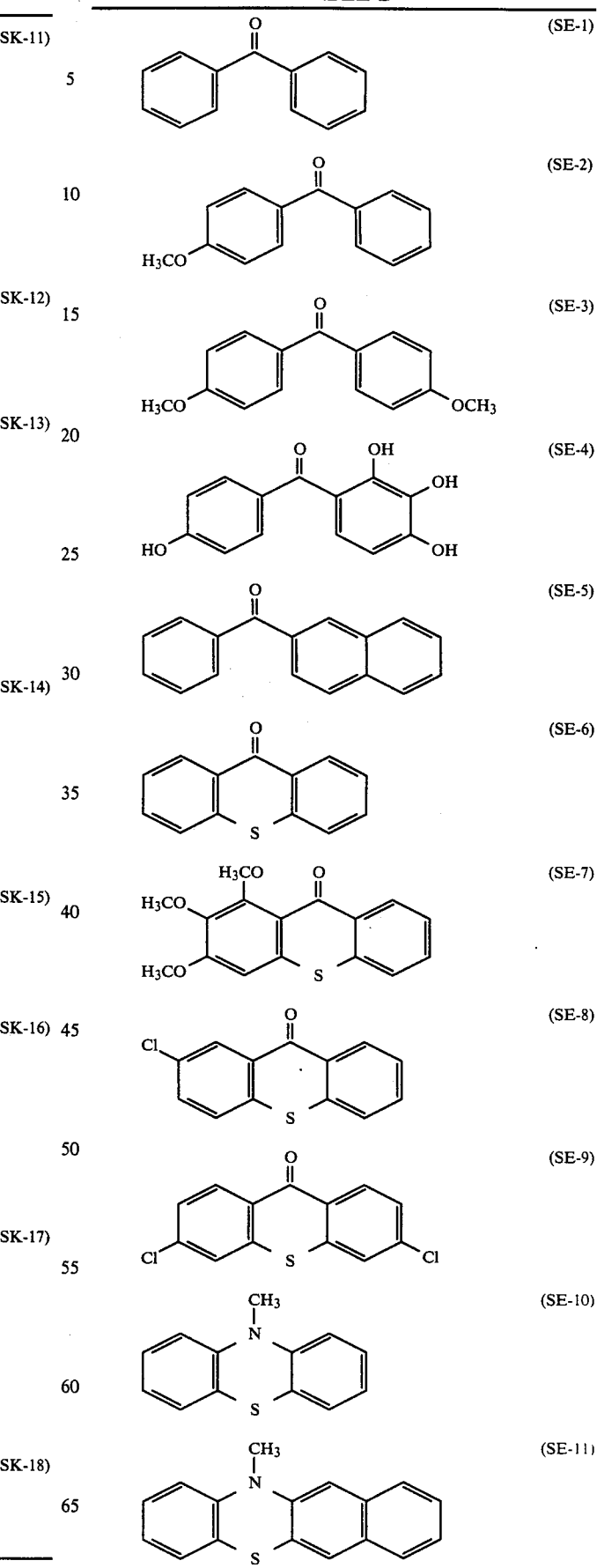

TABLE B-continued

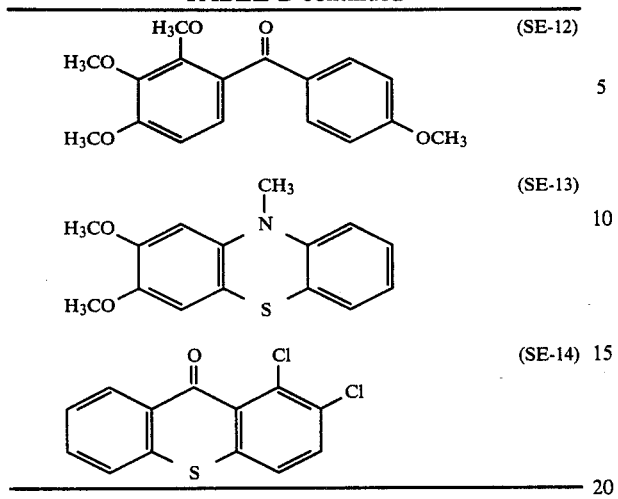

What is claimed is:

1. A photosensitive resin composition for forming a polyimide film pattern, comprising:
   a polyamic acid having a repeating unit represented by general formula (I) and at least one silyl ketone compound represented by general formula (II):

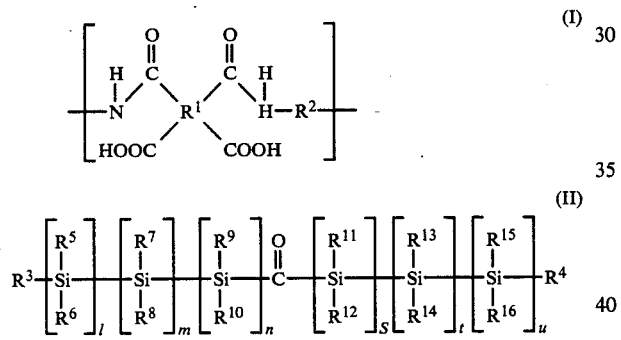

where, $R^1$ is substituted or unsubstituted

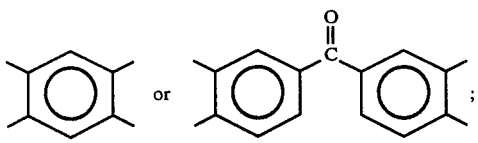

$R^2$ is a divalent organic rinking group; each of $R^3$ and $R^4$ is a substituted or unsubstituted alkyl group having 1 to 12 carbon atoms or a substituted or unsubstituted aromatic group having 6 to 14 carbon atoms; each of $R^5$ to $R^{16}$ is a substituted or unsubstituted alkyl group having 1 to 12 carbon atoms, a substituted or unsubstituted aromatic group having 6 to 14 carbon atoms, or a substituted or unsubstituted silyl group; and each of l, m, n, s, t and u is 0 or 1, at least one of l, m, n, s, t and u being 1.

2. The photosensitive resin composition for forming a polyimide film pattern according to claim 1, wherein the polyamic acid having a repeating unit represented by formula (I) is a polymer synthesized by a polycondensation reaction among a monoamine represented by general formula (III), a tetracarboxylic dianhydride represented by general formula (V), and a diamine represented by general formula (VI):

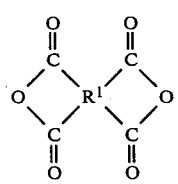

where, $R^1$ is a substituted or unsubstituted

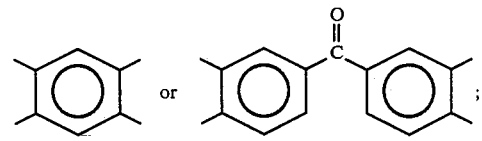

$R^2$ is a divalent organic rinking group; and A is a monovalent organic group.

3. The photosensitive resin composition for forming a polyimide film pattern according to claim 2, wherein the tetracarboxylic dianhydride represented by general formula (V) is pyromellitic dianhydride and/or 3,3',4,4'-benzophenon tetracarboxylic dianhydride, and the diamine represented by general formula (VI) is an aromatic diamine and/or a siloxane compound.

4. The photosensitive resin composition for forming a polyimide film pattern according to claim 1, wherein the polyamic acid having a repeating unit represented by formula (I) is a polymer synthesized by a polycondensation reaction among a dicarboxylic anhydride represented by general formula (IV), a tetracarboxylic dianhydride represented by general formula (V), and a diamine represented by general formula (VI):

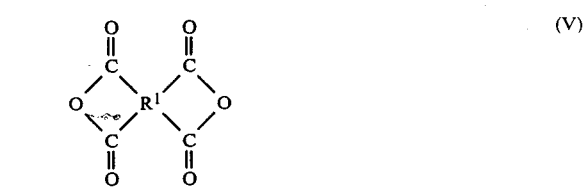

where, $R^1$ is a substituted or unsubstituted

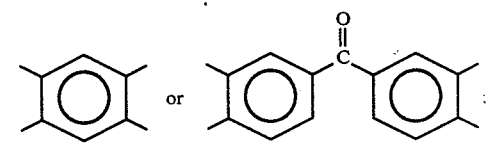

$R^2$ is a divalent organic rinking group; and B is a divalent organic group.

5. The photosensitive resin composition for forming a polyimide film pattern according to claim 3, wherein the tetracarboxylic dianhydride represented by general formula (V) is pyromellitic dianhydride and/or 3,3′,4,4′-benzophenon tetracarboxylic dianhydride, and the diamine represented by general formula (VI) is an aromatic diamine and/or a siloxane compound.

6. The photosensitive resin composition for forming a polyimide film pattern according to claim 1, wherein the polyamic acid having a repeating unit represented by formula (I) is a copolymer synthesized by a polycondensation reaction among maleic anhydride, pyromellitic dianhydride, 3,3′,4,4′-benzophenon tetracarboxylic dianhydride, 4,4′-diamino diphenyl ether, and bis (γ-aminopropyl) tetramethyl disiloxane.

7. The photosensitive resin composition for forming a polyimide film pattern according to claim 1, wherein the silyl ketone compound represented by general formula (II) is at least one compound selected from the group consisting of (SK-2), (SK-4), (SK-5), (SK-6), (SK-11), and (SK-13) given below:

(SK-2)
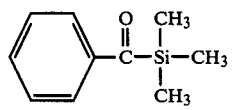

(SK-4)
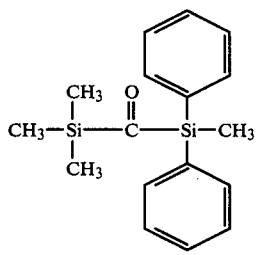

(SK-5)
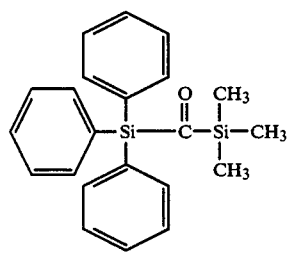

(SK-6)
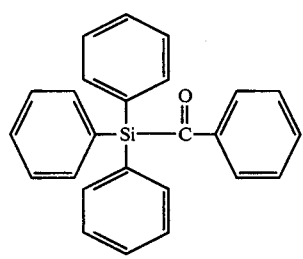

(SK-11)
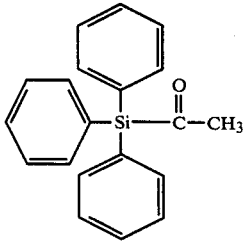

(SK-13)
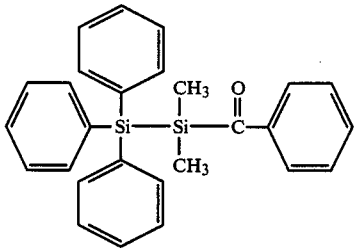

8. The photosensitive resin composition for forming a polyimide film pattern according to claim 1, wherein the silyl ketone compound represented by general formula (II) is used in an amount of 5 to 60 parts by weight based on 100 parts by weight of the polyamic acid.

9. A photosensitive resin composition for forming a polyimide film pattern, comprising:
a polyamic acid having a repeating unit represented by general formula (I);
at least one kind of a silyl ketone compound represented by general formula (II); and
a sensitizer:

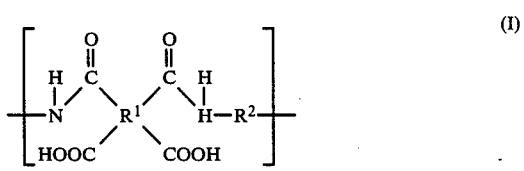

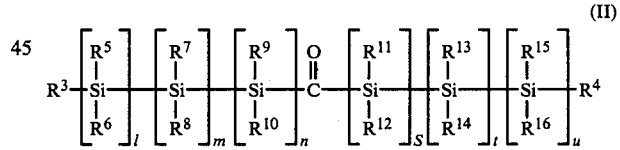

where, $R^1$ is a substituted or unsubstituted

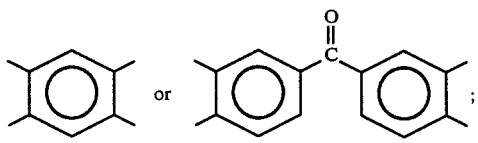

$R^2$ is a divalent organic rinking group; each of $R^3$ and $R^4$ is a substituted or unsubstituted alkyl group having 1 to 12 carbon atoms or a substituted o unsubstituted aromatic group having 6 to 14 carbon atoms; each of $R^5$ to $R^{16}$ is a substituted or unsubstituted alkyl group having 1 to 12 carbon atoms, a substituted or unsubstituted aromatic group having 6 to 14 carbon atoms, or a substituted or unsubstituted silyl group; and each of l, m, n, s, t and u is 0 or 1, at least one of l, m, n, s, t and u being 1.

10. The photosensitive resin composition for forming a polyimide film pattern according to claim 9, wherein the polyamic acid having a repeating unit represented by formula (I) is a polymer synthesized by a polycondensation reaction among a monoamine represented by the general formula (III), a tetracarboxylic anhyride represented by the formula (V), and a diamine represented by general formula (VI):

H$_2$N—A     (III)

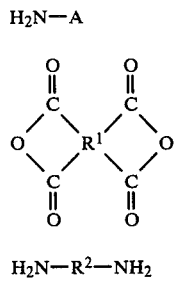 (V)

H$_2$N—R$^2$—NH$_2$     (VI)

where, R$^1$ is a substituted or unsubstituted

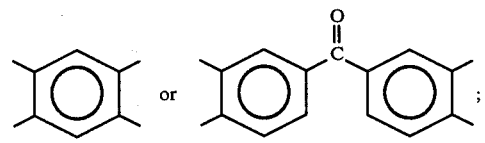

R$^2$ is a divalent organic rinking group; and A is a monovalent organic group.

11. The photosensitive resin composition for forming a polyimide film pattern according to claim 10, wherein the tetracarboxylic dianhydride represented by general formula (V) is pyromellitic dianhydride and/or 3,3',4,4'-benzophenon tetracarboxylic dianhydride, and the diamine represented by general formula is an aromatic diamine and/or a siloxane compound.

12. The photosensitive resin composition for forming a polyimide film pattern according to claim 9, wherein the polyamic acid having a repeating unit represented by formula (I) is a polymer synthesized by a polycondensation reaction among a -dicarboxylic anhydride represented by general formula (IV), a tetracarboxylic dianhydride represented by general formula (V), and a diamine represented by general formula (VI):

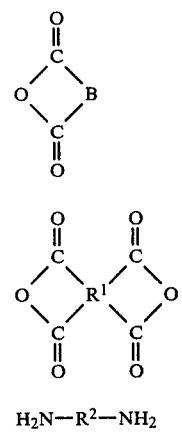

H$_2$N—R$^2$—NH$_2$     (VI)

where, R$^1$ is a substituted or unsubstituted

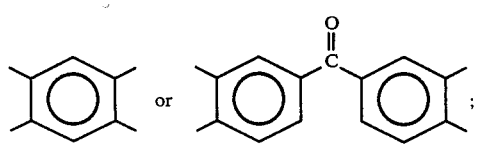

R$^2$ is a divalent organic radical; and B is a divalent organic group.

13. The photosensitive resin composition for forming a polyimide film pattern according to claim 12, wherein the tetracarboxylic dianhydride represented by general formula (V) is pyromellitic dianhydride and/or 3,3',4,4'-benzophenon tetracarboxylic dianhydride, and the diamine represented by general formula (VI) is an aromatic diamine and/or a siloxane compound.

14. The photosensitive resin composition for forming a polyimide film pattern according to claim 9, wherein the polyamic acid having a repeating unit represented by formula (I) is a copolymer synthesized by a polycondensation reaction among maleic anhydride, pyromellitic dianhydride, 3,3',4,4'-benzophenon tetracarboxylic dianhydride, 4,4'-diamino diphenyl ether, and bis (γ-aminopropyl) tetramethyl disiloxane.

15. The photosensitive resin composition for forming a polyimide film pattern according to claim 9, wherein the silyl ketone compound represented by general formula (II) is at least one compound selected from the group consisting of (SK-2), (SK-4), (SK-5), (SK 6), (SK-11), and (SK-13) given below:

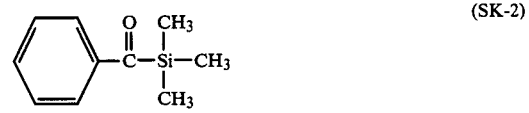 (SK-2)

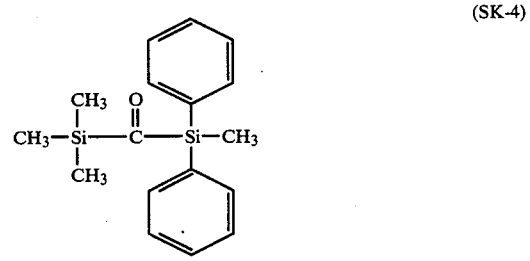 (SK-4)

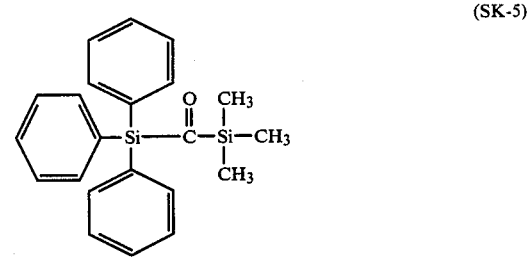 (SK-5)

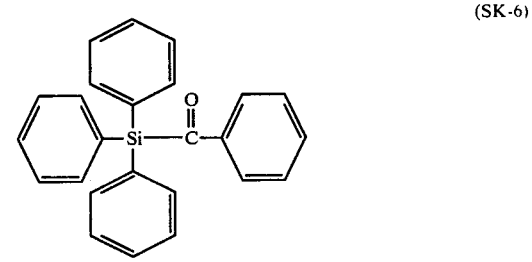 (SK-6)

(SK-11)

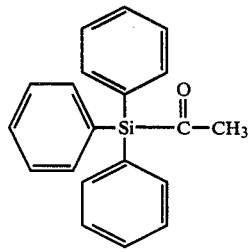

(SK-13)

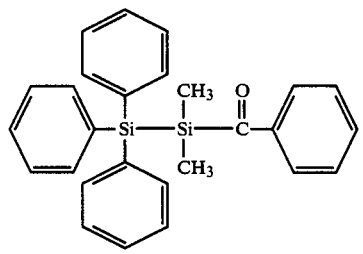

16. The photosensitive resin composition for forming a polyimide film pattern according to claim 9, wherein the silyl ketone compound represented by general formula (II) is used in an amount of 5 to 60 parts by weight based on 100 parts by weight of the polyamic acid.

17. The photosensitive resin composition for forming a polyimide film pattern according to claim 9, wherein the sensitizer is at least one compound selected from the group consisting of benzophenone series compounds, thioxanthone series compounds and phenothiazine series compounds.

18. The photosensitive resin composition for forming a polyimide film pattern according to claim 9, wherein the sensitizer is at least one compound selected from the group consisting of (SE-7), (SE-12), (SE-13) and (SE-14) given below:

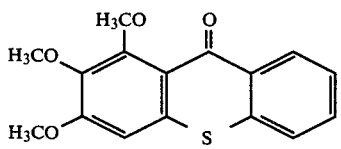
(SE-7)

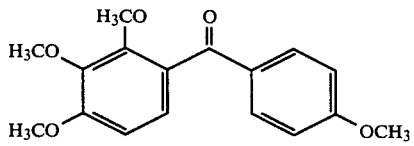
(SE-12)

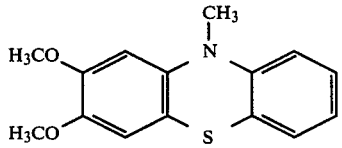
(SE-13)

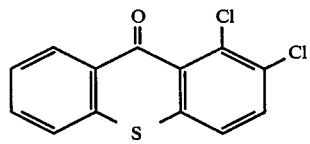
(SE-14)

19. The photosensitive resin composition for forming a polyimide film pattern according to claim 9, wherein the sensitizer is used in an amount of 0.001 to 20% by weight based on the amount of the polyamic acid and the silyl ketone compound.

* * * * *